(12) United States Patent
Saito et al.

(10) Patent No.: US 7,422,932 B2
(45) Date of Patent: Sep. 9, 2008

(54) NONVOLATILE SEMICONDUCTOR MEMORY DEVICE

(75) Inventors: Kazuo Saito, Yokohama (JP); Shogo Takamura, Nishikasugal-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

(21) Appl. No.: 11/530,821

(22) Filed: Sep. 11, 2006

(65) Prior Publication Data

US 2007/0004143 A1 Jan. 4, 2007

Related U.S. Application Data

(62) Division of application No. 10/430,372, filed on May 6, 2003, now Pat. No. 7,145,200.

(30) Foreign Application Priority Data

May 9, 2002 (JP) ............................ 2002-134177

(51) Int. Cl.
*H01L 21/82* (2006.01)
(52) U.S. Cl. .................. 438/128; 438/257; 438/283; 438/672; 257/E21.613; 257/E21.662
(58) Field of Classification Search .......... 257/E21.613, 257/E21.662, E21.683
See application file for complete search history.

(56) References Cited

U.S. PATENT DOCUMENTS

| 5,229,311 | A | 7/1993 | Lai et al. | |
|---|---|---|---|---|
| 6,291,886 | B1 | 9/2001 | Sonoda et al. | 257/751 |
| 6,342,712 | B1 | 1/2002 | Miki et al. | |
| 6,353,242 | B1 | 3/2002 | Watanabe et al. | 257/316 |
| 6,465,826 | B2 | 10/2002 | Kaisai | |
| 6,646,303 | B2 | 11/2003 | Satoh et al. | 257/321 |
| 2001/0028080 | A1 | 10/2001 | Himeno et al. | 257/315 |
| 2002/0064916 | A1* | 5/2002 | Nagai et al. | 438/257 |
| 2003/0147280 | A1 | 8/2003 | Blodgett | 365/185.03 |

FOREIGN PATENT DOCUMENTS

| GB | 2229575 A | 9/1990 |
|---|---|---|
| JP | 06-334050 | 12/1994 |

(Continued)

*Primary Examiner*—Charles D. Garber
*Assistant Examiner*—Cheung Lee
(74) *Attorney, Agent, or Firm*—Hogan & Hartson LLP

(57) ABSTRACT

A nonvolatile semiconductor memory device includes a semiconductor substrate, a memory cell region which is disposed on the semiconductor substrate and has a transistor array of a stacked gate structure having a floating gate, a Ti-containing barrier which is disposed in an upper layer of the memory cell region and covers the memory cell region, and a passivation layer disposed above the Ti-containing barrier. A method of manufacturing the nonvolatile semiconductor memory device includes forming a memory cell structure on a memory cell region on a semiconductor substrate and forming a necessary element structure in a peripheral circuit region except for the memory cell region on the semiconductor substrate, forming an interlayer insulating layer covering the memory cell structure and the element structure, forming a Ti-containing conductive film on the interlayer insulating layer, and forming a Ti-containing wiring layer in an upper layer of the peripheral circuit region by selectively etching the Ti-containing conductive film and forming a Ti-containing barrier in an upper layer of the memory cell region, the barrier covering the memory cell region.

5 Claims, 7 Drawing Sheets

FOREIGN PATENT DOCUMENTS

| | | |
|---|---|---|
| JP | 07-153921 | 6/1995 |
| JP | 09-331031 | 12/1997 |
| JP | 11-008355 | 1/1999 |
| JP | 11-284067 | 10/1999 |
| JP | 02-281663 A | 11/1999 |
| JP | 2000-315395 | 11/2000 |
| JP | 2001-028404 | 1/2001 |
| JP | 2001-093979 | 4/2001 |

\* cited by examiner

NONVOLATILE SEMICONDUCTOR MEMORY DEVICE

CROSS REFERENCE TO RELATED APPLICATION

This is a divisional of application Ser. No. 10/430,372 filed May 6, 2003, the entire contents of which are incorporated by reference. This application is based upon and claims the benefit from the prior Japanese Patent Application No. 2002-134177 filed on May 9, 2002, the entire contents of which are incorporated herein by reference.

BACKGROUND OF THE INVENTION

1. Field of the Invention

The present invention relates to a semiconductor device and a manufacturing method thereof, and more particularly to suppression of data retention failure of a nonvolatile semiconductor memory device having a memory cell array of a stacked gate structure having a floating gate.

2. Description of the Related Art

An EEPROM (Electrically Erasable and Programmable Read Only Memory) capable of electrically writing and erasing information is known as one of nonvolatile memories. Moreover, among EEPROMs, in a NAND-type flash EEPROM suitable for high integration, a plurality of memory transistors are connected in series in a manner that respective sources and drains are shared between adjacent ones, the serially connected memory transistors are connected as one unit to a bit line. Thus data is deleted all at once.

FIG. 1 is a partial cross section view of a device, showing structures of a memory cell region 100 and a peripheral circuit region 200 of a conventional NAND-type flash EEPROM. As shown in the drawing, in the memory cell region 100, transistors of a stacked gate structure, in which a gate oxide film 114, a floating gate electrode 116, an insulating film between gates 118 and a control gate 120 are stacked upward in this order, are formed in arrays and source/drain diffusion regions 112 are formed in a Si substrate 110 below both sides of each gate.

In the peripheral circuit region 200, a transistor element and the like for a power supply circuit and the like are formed as necessary. Usually, this transistor element has a single layer gate structure, in which, for example, a gate electrode 116b is formed in the same layer as a conductive layer constituting the floating gate electrode 116 of the memory cell region 100 and source/drain regions 112b are formed in the semiconductor substrate layer at both sides thereof.

Furthermore, on the memory cell region 100 and peripheral circuit region 200, necessary contacts (126 and 140) and wirings (130, 136 and 142) are formed with a plurality of interlayer insulating films (124, 128, 134 and 138) interposed therebetween and a passivation layer is formed on the resultant structure. The passivation layer is often formed of multiple layers. For example, a SiO$_2$ film with a good covering property is formed as a first passivation film 144 of a lower layer, and a SiNx film hardly moisture permeable is formed as a second passivation film 146 of an upper layer. In order to secure moisture resistance and the like, such passivation films are indispensable components for the nonvolatile semiconductor memory device.

When writing data into each cell, predetermined voltages are applied to the drain region 112 and the control gate electrode 120. Along with the application of voltages, a tunnel current flowing from the drain region 112 to the floating gate electrode 116 via the gate insulating film 114 is generated, by injecting electrons into the floating gate electrode 116.

In an EEPROM which performs a storage operation of binary data, for example, when a threshold voltage Vth of a memory cell is a predetermined value or more due to electrons injected and accumulated in the floating gate electrode 116, state "0" is established.

Moreover, when the control gate electrode 120 is set to a ground potential, and the drain region 112 is set in its floating state, the electrons in the floating gate electrode 116 are extracted via the gate insulating film 114 due to a voltage applied to the source region 112. Thus the threshold voltage Vth of the memory cell transistor is lowered. Such a state where the threshold voltage becomes lower than the predetermined value is state "1."

When reading out the data of each cell, "0" and "1" are read out depending on the presence of the flow of the current by the threshold voltage Vth corresponding to a state of each piece of the data.

In general, to form passivation films, a plasma CVD method is utilized, which is relatively low in a deposition temperature. Furthermore, gas containing hydrogen is used as a gas material, such as monosilane (SiH$_4$) gas, TEOS (Si(OC$_2$H$_5$)$_4$) gas and the like. Thus, a large amount of hydrogen tends to be contained in the passivation films. The hydrogen contained in the films tends to be diffused even in a heat treatment with a relatively low temperature. In some cases, the hydrogen is diffused in an assembly process and the like following after a passivation film formation process and reaches a transistor region of the memory cell.

The hydrogen that has reached the floating gate electrode 116 or the gate insulating film 114 forms a trap level for electrons there. Therefore, in writing/erasing of data in each memory cell, there is a risk that the trap level caused by the diffused hydrogen brings about a fluctuation of the threshold voltage Vth. Furthermore, this fluctuation of Vth becomes a factor causing data retention (a data retention property) failure.

Meanwhile, for miniaturization of a pattern upon demand of much higher integration, in the NAND-type flash EEPROM, an influence of a variation in processing accompanied with the miniaturization on the number of times of writing/erasing has been no longer negligible. Thus, a margin for the data retention failure has been decreased.

Furthermore, recently, an EEPROM storing multi-value data of three different values or more in each memory cell has been put into practical use for achieving a larger memory capacity, aside from the one performing the conventional binary data storage operation of "1" and "0." However, in the case of dealing with such multi-value data, an allowable breadth of a threshold value distribution is made narrower than that in the conventional binary data storage operation, thus leading to a situation where the data retention failure far more tends to occur.

SUMMARY OF THE INVENTION

A nonvolatile semiconductor memory device according to an aspect of the present invention includes a semiconductor substrate, a memory cell region which is disposed on the semiconductor substrate and has a transistor array of a stacked gate structure having a floating gate, a Ti-containing barrier which is disposed in an upper layer of the memory cell region and covers the memory cell region, and a passivation layer disposed above the Ti-containing barrier.

A method of manufacturing a nonvolatile semiconductor memory device according to another aspect of the present invention includes forming a memory cell structure on a memory cell region on a semiconductor substrate and forming a necessary element structure in a peripheral circuit region except for the memory cell region on the semiconductor substrate, forming an interlayer insulating layer covering the memory cell structure and the element structure, forming a Ti-containing conductive film on the interlayer insulating layer, and forming a Ti-containing wiring layer in an upper layer of the peripheral circuit region by selectively etching the Ti-containing conductive film and forming a Ti-containing barrier in an upper layer of the memory cell region, the barrier covering the memory cell region.

DETAILED DESCRIPTION OF THE INVENTION

First Embodiment

Figure 2:
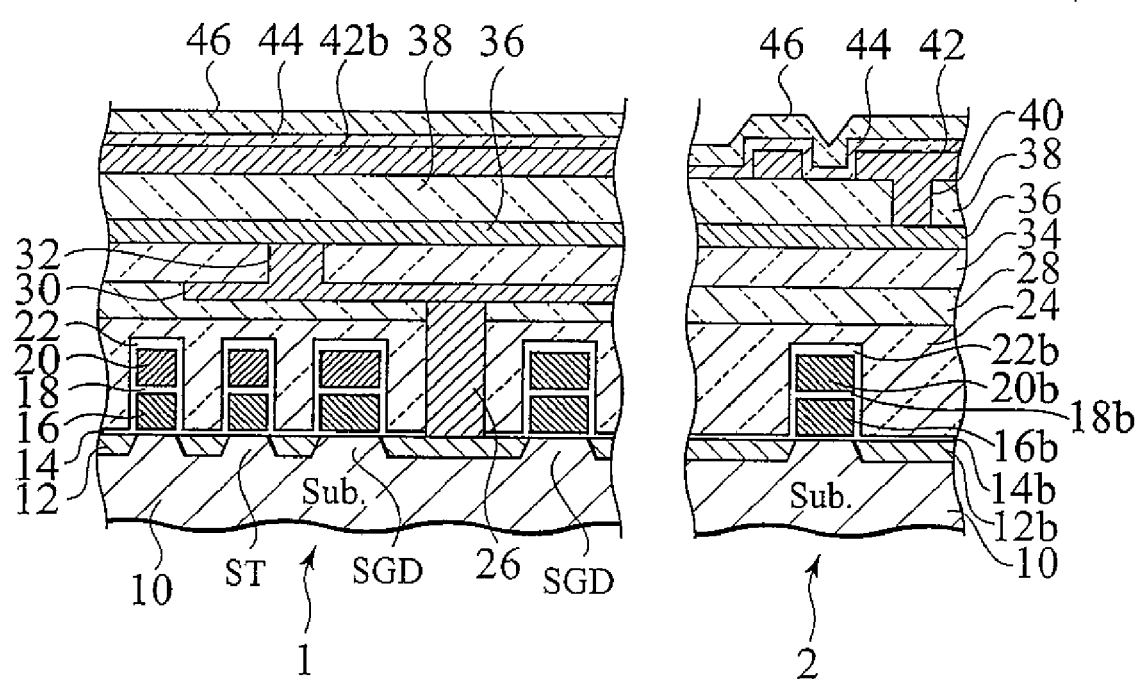
FIG. 2 is a partial cross sectional view of a nonvolatile semiconductor memory device according to a first embodiment of the present invention.

FIG. 2 is a cross-sectional view showing a structure of a nonvolatile semiconductor memory device according to a first embodiment of the present invention. Herein, a NAND-type flash EEPROM is shown as one example of the nonvolatile semiconductor memory device. A memory cell region 1 is shown on the left side of the drawing and a peripheral circuit region 2 is shown on the right side thereof.

A main characteristic of the nonvolatile semiconductor memory device according to the first embodiment is that a Ti-containing barrier 42b covering the entire area of the memory cell region 1 is provided in an upper layer of the memory cell region 1 and a passivation layer, which is composed of first and second passivation films 44 and 46, is formed thereon. The Ti-containing barrier 42b prevents diffusion of hydrogen into a transistor region of a memory cell from the passivation layer and thus a data retardation fluctuation of a memory cell transistor attributable to hydrogen can be suppressed. Hereinafter, the structure of the nonvolatile semiconductor memory device according to the first embodiment will be described more in detail.

As shown in FIG. 2, the memory cell region 1 and the peripheral circuit region 2 are formed on a single Si substrate 10. On the Si substrate 10 in the memory cell region 1, an array of transistors with a stacked gate structure is formed as extending in the left and right direction of the page space. Among the transistors in the array, transistors positioned to the left and right of a contact 26 are selection gate transistors SGD and transistors other than those are memory cell transistors ST. For example, one memory cell unit is constituted of 16 memory cell transistors ST.

Each of the transistors in the memory cell region 1 has a stacked gate structure in which a gate insulating film (a tunnel oxide film) 14 with a thin film thickness, a floating gate electrode 16, an insulating film between gates 18 and a control gate electrode 20 which are sequentially stacked on the Si substrate 10, and an oxide film 22 coating around the structure. Moreover, each transistor has source and drain regions 12 in a surface layer of the Si substrate 10 at positions corresponding to approximately both sides of the floating gate electrode 16.

Meanwhile, in the peripheral circuit region 2, a transistor for a power supply circuit and the like, for example, is formed. This transistor does not need to have the stacked gate structure. However, the same stacked gate structure may be formed in the peripheral circuit region 2 as shown in FIG. 2. because of adjusting to the memory cell region 1 in a fabrication process. For example, the transistor is constituted of a gate insulating film 14b, a gate electrode 16b, an insulating film 18b, another gate electrode 20b and source and drain regions 12b formed on the surface layer of the Si substrate 10. Note that the gate electrode 16b is applied predetermined voltage, while the gate electrode 20b is not applied voltage. Thus, the gate electrode 16b serves as a control gate, but the gate electrode 20b does not work, therefore, the stacked gate in the peripheral circuit region 2 functions as a single gate.

Interlayer insulating films 24 and 28 are formed so as to cover the transistor array in the memory cell region 1 and the transistor in the peripheral circuit region 2. Moreover, the contact 26 is formed, which penetrates these interlayer insulating films 24 and 28 and is connected to the drain region 12. A first wiring 30 connected to the contact 26 is formed in an upper layer of the interlayer insulating film 28, a contact 32 penetrating an interlayer insulating film 34 is formed, and a first metal wiring layer (a bit line) 36 is formed on the interlayer insulating film 34.

Figure 1:
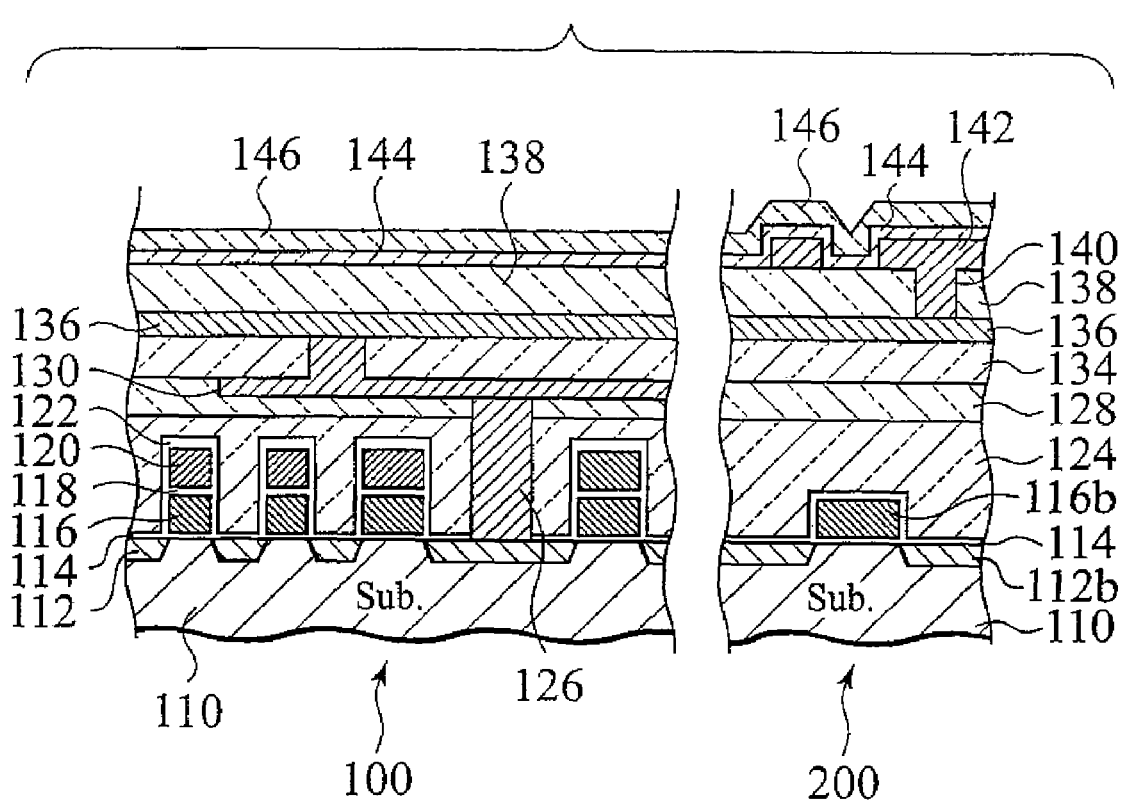
FIG. 1 is a partial cross sectional view of a conventional nonvolatile semiconductor memory device.

Furthermore, an interlayer insulating film 38 is formed on the first metal wiring layer 36, and a necessary contact 40 and a second metal wiring layer 42 are formed in the peripheral circuit region 2. Referring to FIG. 1, conventionally, this second metal wiring layer 42 is necessary only on the peripheral circuit region 2 and thus is not provided on the memory cell region 1. However, in the nonvolatile semiconductor memory device according to the first embodiment, the Ti-containing barrier 42b covering almost the entire area of the memory cell region 1 is formed of the same wiring layer as the second metal wiring layer 42. This second metal wiring layer 42 includes a wiring material containing titanium (Ti) that has at least a gettering effect of hydrogen, for example, besides a Ti single material, a Ti compound material such as titanium nitride (TiN), titanium silicide ($TiSi_2$) and the like. Moreover, a single layer or multiple layers may be formed of these Ti-containing films described above. Furthermore, in order to achieve resistance, a conductive layer having conductivity higher than that of the Ti-containing film may be laminated.

As for such a conductive layer, an Al layer, a Cu layer, an Al—Cu layer, an Al—Si layer and the like are enumerated.

Furthermore, on the second metal wiring layer 42 and the Ti-containing barrier 42b, the first and second passivation films 44 and 46 are sequentially formed. As the first passivation film 44, for example, a highly insulative TEOS film that is formed by a plasma CVD method and has a good covering property (hereinafter referred to as a d-TEOS film) is preferably used. As the second passivation film 46, a SiNx film that is formed by the plasma CVD method and has high moisture resistance (hereinafter referred to as a P—SiN film) is preferably used. Thus, the passivation layer is obtained by lamination of the d-TEOS film and the P—SiN film. Thus, a passivation layer with sufficient covering and insulating properties can be obtained.

For the formation of the P—SiN film that is the second passivation film 46, the plasma CVD method is used, and a material including hydrogen gas, such as $SiH_4$ and the like, is used as a gas material. Since the film formation is performed at a deposition temperature as low as 200 to 300° C., relatively many Si—H bonds tend to be left in the film. An amount of hydrogen thus left therein is equivalent to 10 atom % to 20 atom %. The hydrogen in the film is easily diffused even by a heat treatment at a low temperature. However, according to the non-volatile semiconductor memory device of the first embodiment, Ti in the Ti-containing barrier 42b covering the memory cell region has the hydrogen gettering effect. Thus hydrogen is absorbed at the stage of reaching the Ti-containing barrier 42b. Thus, diffusion of hydrogen into a direction deeper than the Ti-containing barrier is prevented. Accordingly, intrusion of hydrogen into the memory cell transistor region, particularly into the floating gate to be a charge accumulation layer, is suppressed and can be avoided a fluctuation of a threshold voltage attributable to the hydrogen intrusion.

Figure 3A:
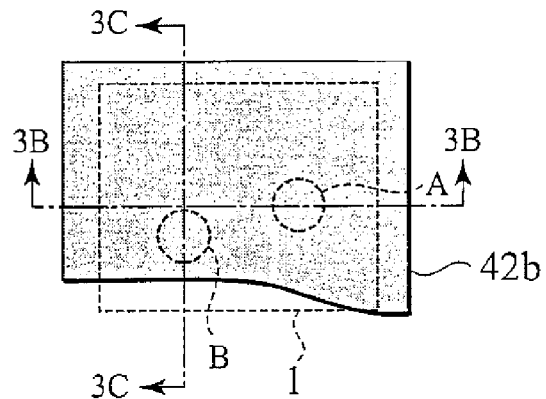
FIG. 3A is a plan view of a memory cell region in the nonvolatile semiconductor memory device according to the first embodiment of the present invention.
Figure 3B:
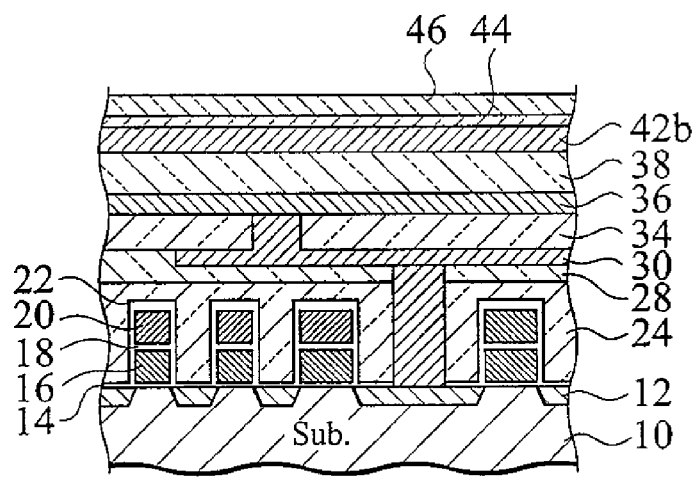
FIG. 3B is a cross-sectional view of A region along the line 3B-3B in FIG. 3A
Figure 3C:
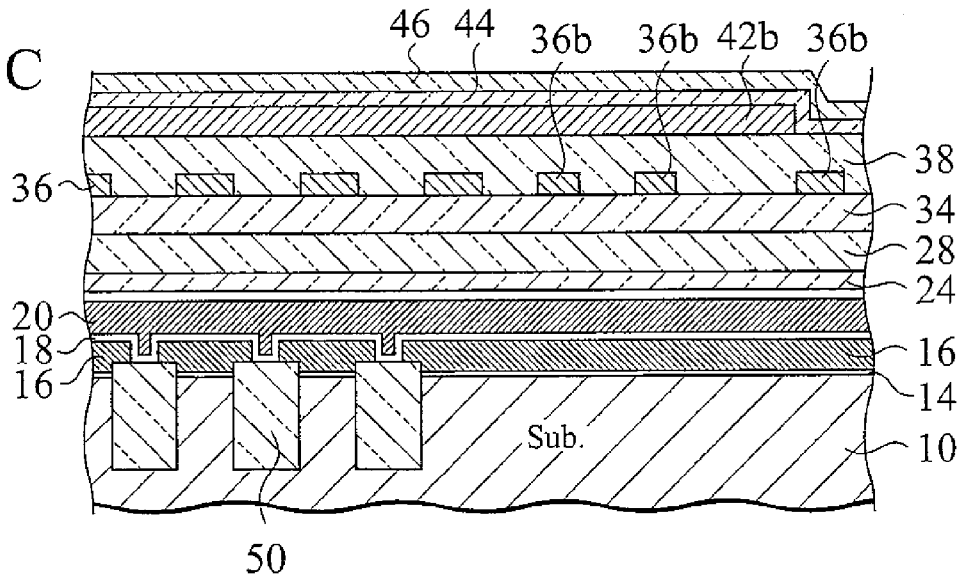
FIG. 3C is a cross-sectional view of B region along the line 3C-3C in FIG. 3A.

FIG. 3A is a partial plan view of the memory cell region 1 of the nonvolatile semiconductor memory device according to the first embodiment, and FIGS. 3B and 3C are cross-sectional views of broken line portions A and B in FIG. 3A, respectively.

As shown in FIG. 3A, the Ti-containing barrier 42b is formed so as to cover the entire area of the memory cell region 1 shown by the broken line portion. Moreover, as clear from FIGS. 3B and 3C, in a plane pattern of the memory cell region 1, the floating gate electrode 16 and the control gate electrode 20 are arranged in a stripe manner. Moreover, a pattern of striped element isolation regions 50 is disposed in a line in a direction orthogonal to the above electrode pattern, and a memory transistor having the floating gate electrode 16 is formed in an active region isolated by the element isolation regions 50. The first metal wiring 36 is also disposed parallel to the element isolation regions 50. Note that the first metal wirings 36b are dummy wirings.

As shown in FIGS. 3A to 3C, the Ti-containing barrier 42b is formed so as to completely cover the memory cell region 1. Thus, it is possible to effectively prevent a fluctuation of a threshold voltage Vth attributable to hydrogen that is dispersed from the first and second passivation films 44 and 46 and reaches the respective memory transistor regions.

Figure 4A:
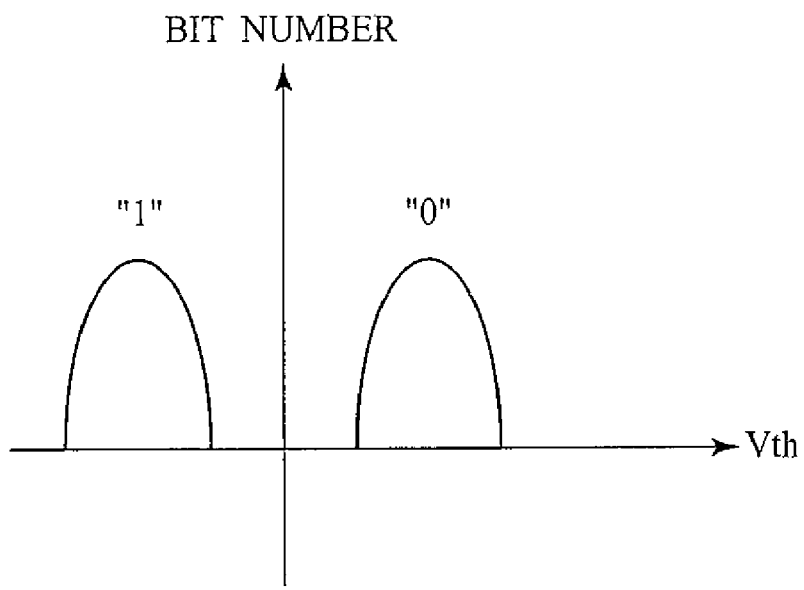
FIG. 4A is a graph showing a threshold voltage distribution in the case of a binary data operation according to the first embodiment of the present invention.
Figure 4B:
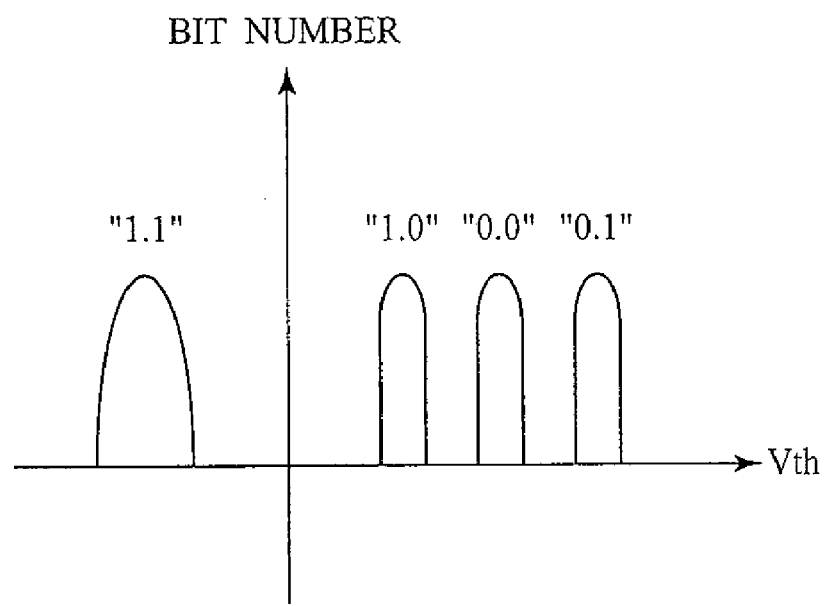
FIG. 4B is a graph showing a threshold voltage distribution in the case of a multi-value data operation according to the first embodiment of the present invention.

FIG. 4A is a graph showing a threshold voltage distribution in the case of performing a binary data storage operation by the EEPROM according to the first embodiment of the present invention. In the case of the binary data storage operation, for example, between −5V and +5V, threshold values Vth of a transistor for respective states of "1" and "0" are set. On the other hand, FIG. 4B is a graph showing a threshold voltage distribution in a memory transistor in the case of performing a multi-value data storage operation, for example, a four-value data storage operation by the EEPROM according to the first embodiment of the present invention. In the case of the four-value data storage-operation, it is necessary to set four states of "1.1", "1.0", "0.0" and "0.1" between the same −5V and +5V. Particularly, as shown in the graph of FIG. 4B, the three states of "1.0", "0.0" and "0.1" are set between 0 and +5V. Thus, a margin of a shift width of the threshold values Vth becomes substantially narrower than that of the binary data storage operation. When the shift of the threshold value is applied to the threshold distribution of the adjacent data and reaches a value of a read voltage (a read verify voltage) of the adjacent data, a data retention failure occurs.

However, according to the nonvolatile semiconductor memory device of the first embodiment of the present invention, with respect to even the threshold value in the state "0.1", which is most vulnerable to the data retention failure, an amount of fluctuations of threshold distributions after performing repetitive write tests by about 100,000 times can be reduced by about 25% of the conventional one.

With reference to FIGS. 5A to 5C and FIGS. 6D to 6F, description will be given below for a method of manufacturing the nonvolatile semiconductor memory device according to the first embodiment of the present invention.

Figure 5A:
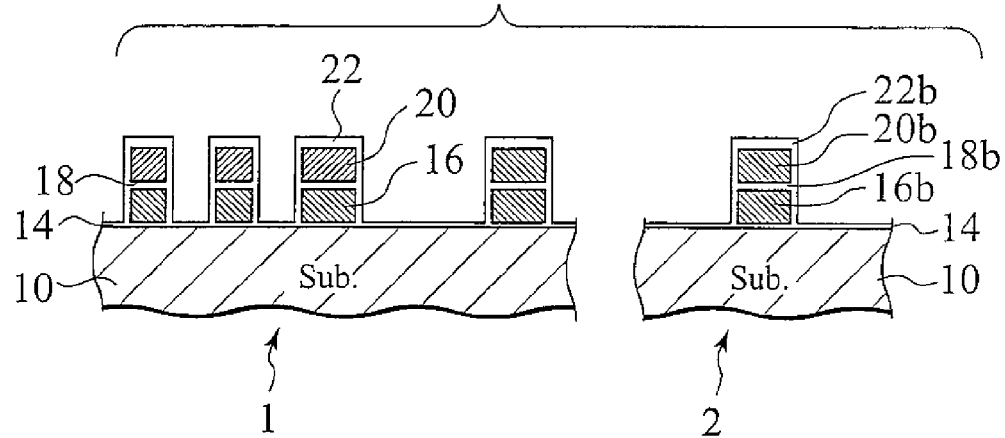
FIGS. 5A to 5C and FIGS. 6D to 6F are cross-sectional views of the device in respective steps showing a method of manufacturing the nonvolatile semiconductor memory device according to the first embodiment of the present invention.

First, as shown in FIG. 5A, well regions and element isolation regions (not shown) are formed in a Si substrate 10. Next, on the Si substrate 10, a gate insulating film (a tunnel oxide film) 14 with a film thickness of about 10 nm is formed by use of a CVD method, a thermal oxidation method or the like. In a memory cell region 1, on the gate insulating film 14, a floating gate electrode 16 is formed of a polycrystalline silicon film with a film thickness of about 50 nm to 100 nm by use of a sputtering method, the CVD method or the like. Moreover, also in a peripheral circuit region 2, on the gate insulating film 14, a gate electrode 16b is formed in the same layer as the floating gate electrode 16. Subsequently, in the memory cell region 1, an insulating film between gates 18 is formed by use of the CVD method or the like.

This insulating film between gates 18 is formed of, for example, a silicon oxide film, a silicon nitride film, a silicon oxynitride film or an ONO film (oxide/nitride/oxide) that is a lamination film thereof. Furthermore, on the insulating film between gates, a control gate electrode layer 20 with a film thickness of about 100 nm to 200 nm is formed by use of the sputtering method, the CVD method or the like. The control gate electrode layer 20 may be formed of, for example, a polycrystalline silicon film, a lamination film of polycrystalline silicon and metal silicide, or a metal gate film made of only a metal material. Moreover, also in the peripheral circuit region 2, an insulating film 18b and another gate electrode layer 20b are formed in the same layer as the insulating film 18 and the control gate electrode layer 20 respectively. Accordingly, stacked gate structures are formed in both of the memory cell region 1 and peripheral circuit region 2. Furthermore, an oxide film 22 is formed so as to cover surfaces of the respective gate structures.

Figure 5B:
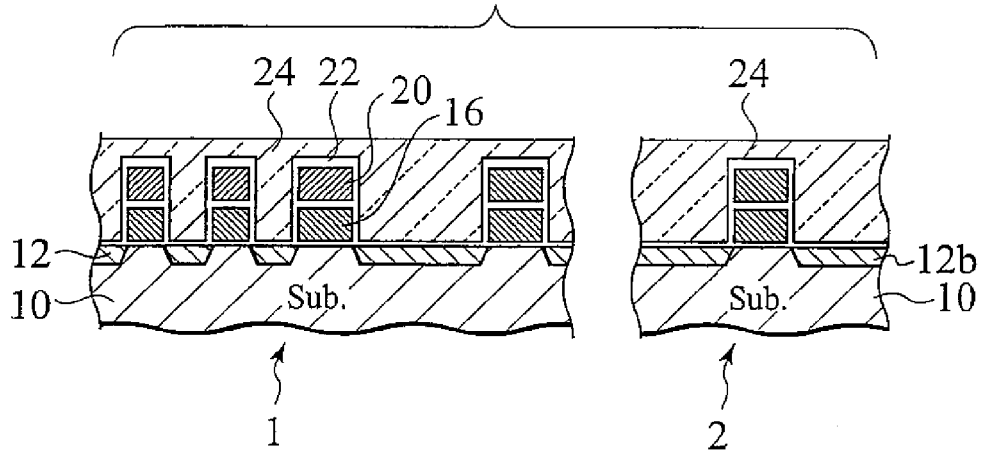

Next, as shown in FIG. 5B, while using each gate electrode as a mask, ion implantation of a reverse conductive impurities type to that of the wells is performed, thus forming source and drain regions 12 through an annealing process. Furthermore, an interlayer insulating film 24 is formed of BPSG (boron phosphosilicate glass) or the like, for example, by use of the CVD method.

Figure 5C:
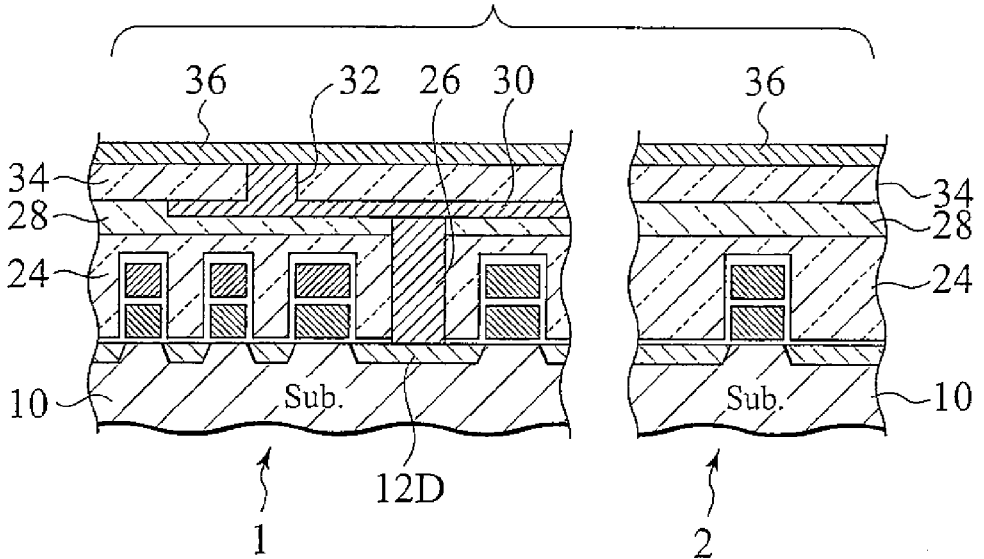

As shown in FIG. 5C, a contact hole is made open in the interlayer insulating film 24, the contact hole having its bottom exposed to a drain region 12D, by use of a RIE (Reactive Ion Etching) method. The contact hole is filled with a conductive material such as, for example, W (tungsten) and the like, and a surface thereof is flattened, thus forming a contact 26. An interlayer insulating film 28 is formed by a similar method and a first wiring 30 is formed in an upper layer of the interlayer insulating film 28 by use of a damascene method and the like. Furthermore, an interlayer insulating film 34 is formed thereon and a necessary contact 32 is further formed therein. Note that, also in the peripheral circuit region 2, the interlayer insulating films 24, 28 and 34 are sequentially formed along with the manufacturing process of the memory cell region 1 and an unillustrated wiring layer is formed according to need. Then, a first metal wiring layer (a bit line) 36 is formed on the interlayer insulating film 34.

Subsequently, with reference to FIGS. 6D to 6F, description will be given of a method of manufacturing a second metal wiring layer 42 and a Ti-containing barrier 42b.

Figure 6D:
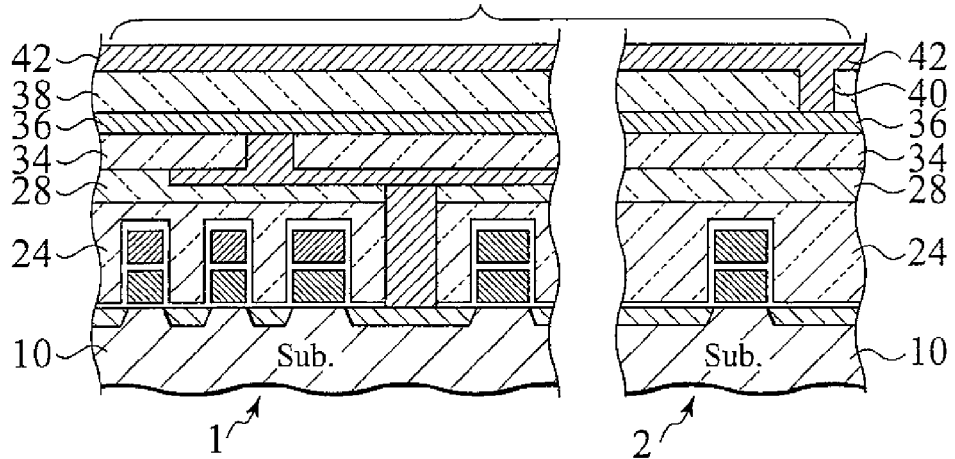

As shown in FIG. 6D, after making a necessary contact hole open in an interlayer insulating film 38, the second metal wiring layer 42 is formed on the entire surface of the resultant structure by use of a sputtering method and the like. Specifically, the second metal wiring layer 42 is formed by sequentially laminating: a Ti film with a film thickness of about 25 nm; a TiN film with a film thickness of about 25 nm; and an Al—Cu film with a film thickness of about 800 nm.

Figure 6E:
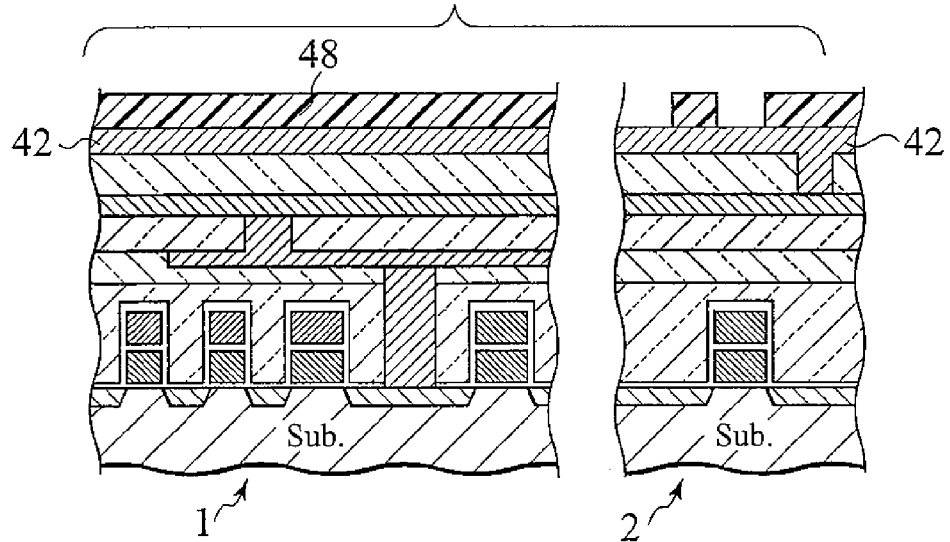
Figure 6F:
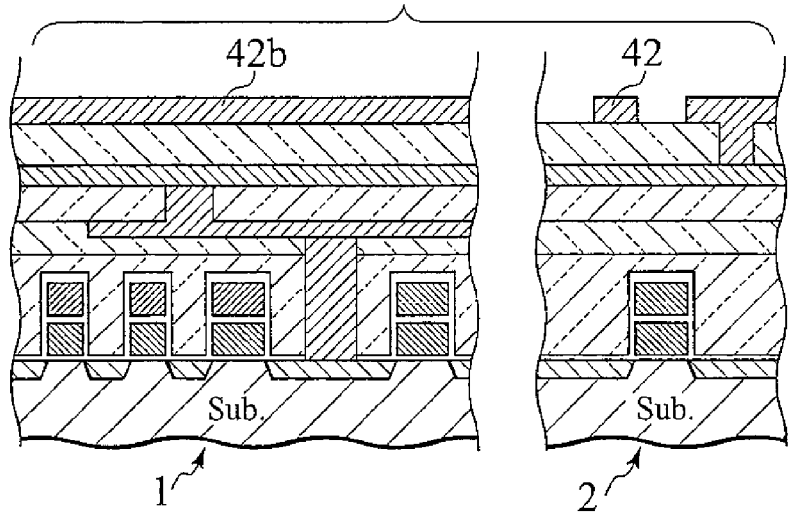

Thereafter, as shown in FIG. 6E, resist 48 is coated on the second metal wiring layer 42, and a pattern of the resist 48 corresponding to a necessary wiring pattern is formed in the peripheral circuit region 2, and a pattern of the resist 48 covering the entire area of the memory cell region 1 is formed in the memory cell region 1. By use of these patterns of the resist 48 as an etching mask, the second metal wiring layer 42 is etched. Accordingly, the necessary wiring layer 42 is formed in the peripheral circuit region 2 and the Ti-containing barrier 42b is formed in the memory cell region 1. The resist 48 that is no longer necessary is removed thereafter.

Returning to FIG. 2, description will be given of the steps of forming a passivation layer. On the substrate surface, on which the Ti-containing barrier 42b and the second metal wiring layer 42 are formed, a first passivation film 44 composed of a TEOS film with a good covering property is formed. Specifically, after forming a TEOS film with a film thickness of about 50 nm by use of a plasma CVD method, in order to obtain a much higher covering property, a TEOS film with a film thickness of about 900 nm is formed by use of a high density plasma CVD method.

Furthermore, a second passivation film 46 is formed on the first passivation film 44. As the second passivation film 46, a silicon nitride (SiNx) film with good moisture resistance is formed by using monosilane (SiH4) gas and nitrogen monoxide (N2O) gas as a gas source, and the plasma CVD method.

As described above, in the nonvolatile semiconductor memory device according to the first embodiment of the present invention, the Ti-containing barrier 42b is provided in the upper layer of the memory cell region 1. Thus diffusion of hydrogen in the passivation films can be prevented by this Ti-containing barrier 42b. Therefore, the occurrence of the shift of the threshold voltage attributable to diffusion of hydrogen into the floating gate electrode 16 is suppressed. Particularly, in the case of performing the multi-value data storage operation, in which the margin of the threshold voltage is narrow, effectiveness of the effect of suppressing the hydrogen diffusion by the Ti-containing barrier 42b is high. Moreover, the Ti-containing barrier 42b can be formed in the same layer as the second metal wiring layer 42 and thus the Ti-containing barrier is applicable only by changing a mask pattern used in patterning the second metal wiring layer 42.

Second Embodiment

Figure 7A:
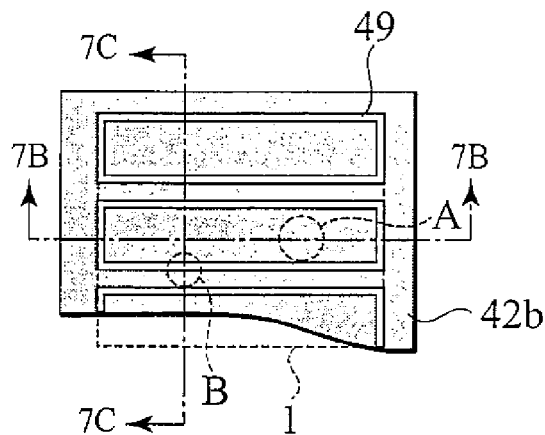
FIG. 7A is a plan view of a memory cell region in a nonvolatile semiconductor memory device according to a second embodiment of the present invention.
Figure 7B:
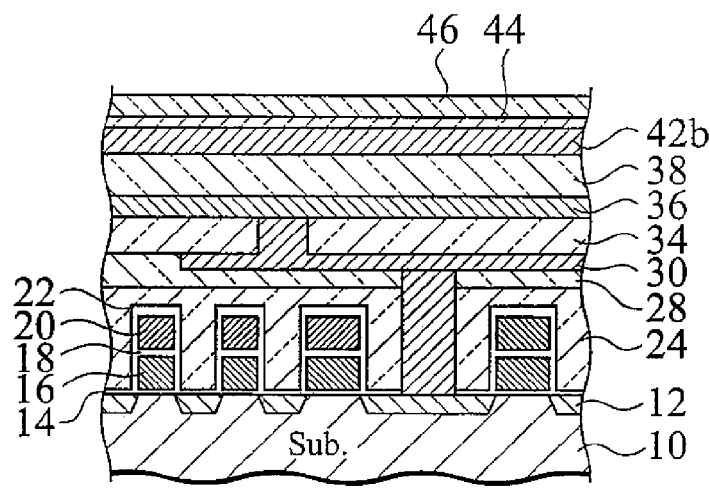
FIG. 7B is a cross-sectional view of A region along the line 7B-7B in FIG. 7A
Figure 7C:
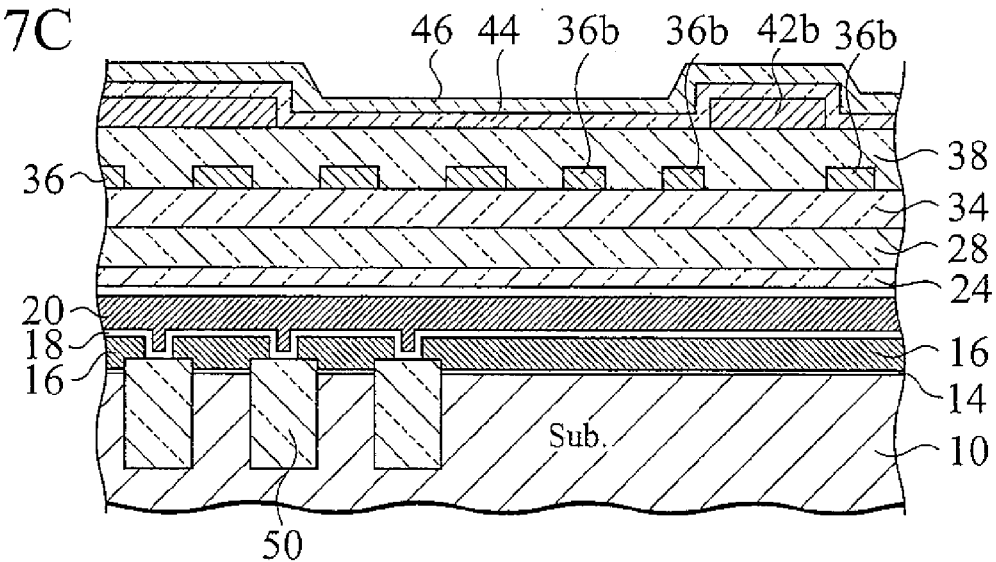
FIG. 7C is a cross-sectional view of B region along the line 7C-7C in FIG. 7A.

FIGS. 7A to 7C show a constitution of a nonvolatile semiconductor memory device according to a second embodiment of the present invention. The nonvolatile semiconductor memory device according to the second embodiment is also the NAND-type flash EEPROM and a basic structure thereof is common to that of the first embodiment, thereby omitting redundant description thereof. A different point from the first embodiment is that the Ti-containing barrier 42b does not cover the entire area of the memory cell region 1 but has a slit region 49 in a part thereof.

For example, as shown in FIG. 7A, the slit region 49 may divide the memory cell region 1 into a plurality of regions and have a frame shape surrounding the respective regions by slits parallel to a word line and a bit line. FIG. 7B is a cross-sectional view of a broken portion A in FIG. 7A and FIG. 7C is a cross-sectional view of a broken line portion B in FIG. 7A. The cross section structure shown in FIG. 7B is common to the structure according to the first embodiment. However, in the EEPROM according to the second embodiment, the Ti-containing barrier 42b has the slit region 49 and thus the Ti-containing barrier 42b is not formed in a part of the upper layer of the memory cell transistor in the cross section structure shown in FIG. 7C.

As described above, the Ti-containing barrier 42b does not necessarily cover the entire area of the memory cell region. To be more specific, as shown in FIG. 7A, for example, considered is a case where the memory cell region is divided into 16 regions by slits parallel to the bit line, and a frame-shaped slit with a 2 bit line width is formed around each region. In this case, assuming that a 1 bit line has 1024 blocks and one block has 16 bits, memory cells not covered with the Ti-containing barrier due to the slit are equivalent to 983040 bits in total. Considering that there are 128 Mbits in the total memory cells, the area of the memory region not covered with the Ti-containing barrier 42b is about 2% of the entire area. In terms of the number of memories, the ones not covered with the Ti-containing barrier correspond to about 1% of the total memories. Under this condition, it is confirmed that the Ti-containing barrier 42b shows approximately the same threshold fluctuation suppression effect as that of the nonvolatile semiconductor memory device according to the first embodiment, which includes the Ti-containing barrier without a slit. Specifically, when the Ti-containing barrier 42b covers 98% of the memory cell region, a surely good threshold fluctuation suppression effect is obtained. Therefore, for example, if the Ti-containing barrier is one covering 90% or more of the entire area of the memory cell region 1, preferably 95% or more, a hydrogen diffusion prevention effect approximately the same as that obtained in the case of covering the entire memory cell region can be obtained. Thus, in the case of displaying the multi-data operation, the effect of suppressing the threshold fluctuation is obtained.

Moreover, there are differences in thermal expansion coefficients and the like between the Ti-containing barrier 42b and its upper and lower interlayer insulating layers. Thus, when the area of the Ti-containing barrier 42b is increased, there is a risk that defects such as a crack and the like due to stresses may occur. However, the slit region 49 formed in the Ti-containing barrier 42b has a function of relaxing these stresses.

The shape of the slit region 49 is not limited, and the slit region may have various shapes such as a stripe shape and the like besides the frame shape as shown in FIG. 7A. Note that, when the slit width becomes extremely wide, hydrogen is diffused from a gap between the slits. Thus, the slit width is preferably equivalent to several times the gate width of the memory cell transistor or less.

Note that, in the case of forming slits on a region where selection gates are disposed, which is parallel to a NAND cell array (word line), there is no need to reduce the area of the Ti-containing barrier 42b virtually covering over the memory cell. Thus, a high hydrogen barrier effect can be maintained and, in addition, a stress relaxation effect by the slits can be provided.

Note that the EEPROM according to the second embodiment can be manufactured by use of a similar method to that according to the first embodiment.

The nonvolatile semiconductor memory device of the present invention has been described above along with the embodiments. However, it is apparent to those skilled in the art that the present invention is not limited to the description above and various modifications and replacements can be made.

For example, in the above embodiments, description was given of the NAND-type flash EEPROM. However, without being limited to the flash-type or the NAND-type EEPROM, as long as the memory device is a nonvolatile semiconductor memory device having a problem of a threshold voltage fluctuation due to hydrogen diffusion, the above structure using the Ti-containing barrier is similarly applicable.

Moreover, in the above-described embodiments, the description was given of the examples of forming the Ti-containing barrier covering the memory cell region in the same layer as the second metal wiring layer formed in the peripheral circuit region. However, a Ti-containing layer may formed independently without using the second metal wiring layer and the Ti-containing barrier may be formed by use of the Ti-containing layer. Furthermore, in the case where third and fourth metal wiring layers are formed in the peripheral circuit region, the Ti-containing barrier may be formed by use of any one of these wiring layers.

Furthermore, the passivation layer does not need to be formed immediately on the Ti-containing barrier but may be formed on or above the Ti-containing barrier.

As described above, according to the characteristics of the nonvolatile semiconductor memory device of the present invention, since the Ti-containing barrier is provided in the upper layer of the memory cell region, the diffusion of hydrogen into the memory cell transistor from the passivation layer and the like can be prevented. As a result, the threshold fluctuation of the memory cell transistor attributable to the diffused hydrogen is suppressed and thus the data retention failure can be prevented.

The foregoing nonvolatile semiconductor memory device further has a Ti-containing wiring layer disposed in a region excluding the foregoing memory cell region on the semiconductor substrate. In the case where the device has the peripheral circuit region, the foregoing Ti-containing barrier may be formed in the same layer as this Ti-containing wiring layer. In this case, the Ti-containing barrier can be formed by use of a part of the Ti-containing wiring layer utilized for a necessary wiring in the peripheral circuit region. Thus, without being accompanied by any burden of the manufacturing process, the Ti-containing barrier can be formed in the upper layer of the memory cell region.

In the case of covering at least 90% or more of the area of the memory cell region with the foregoing Ti-containing barrier, obtained is approximately the same threshold fluctuation suppression effect of the memory cell transistor as that obtained in the case of forming the Ti-containing barrier so as to practically cover the entire area of the memory cell region.

Further, in the case where the foregoing Ti-containing barrier has the plane pattern shape with a slit, the slit has the stress relaxation effect. Thus, it is possible to prevent occurrence of defects due to heat stress and the like in the Ti-containing barrier.

Furthermore, in the case where each memory cell in the foregoing memory cell region stores multi-value data of three values or more, the margin of the threshold voltage fluctuation of the memory cell transistor is narrowed. Thus, the effects of preventing the diffusion of hydrogen and suppressing the threshold fluctuation, which are obtained by the Ti-containing barrier, become extremely large.

In the case where the foregoing passivation layer includes a silicon nitride film, the moisture resistance of the nonvolatile semiconductor memory device can be enhanced by the silicon nitride film. At the same time, since the silicon nitride film contains a large amount of hydrogen, the effectiveness of the hydrogen diffusion suppression effect obtained by the foregoing Ti-containing barrier is large.

Furthermore, according to the characteristics of the method of manufacturing the nonvolatile semiconductor memory device of the present invention, by utilizing the step of forming a wiring layer in the peripheral circuit region, the Ti-containing barrier is formed in the upper layer of the memory cell region by use of the same wiring layer. Thus, without being accompanied by any burden of the manufacturing process, a nonvolatile semiconductor memory device can be provided, which has a Ti-containing barrier having a hydrogen diffusion prevention effect and can prevent data retardation failure.

Note that it is also satisfactory that the foregoing manufacturing method further has a step of forming a passivation layer on or above the Ti-containing wiring layer and the Ti-containing barrier. Furthermore, this step of forming the passivation layer may have a step of forming a TEOS film by use of a plasma CVD method and a step of forming a silicon nitride film by use of the plasma CVD method. In this case, in addition to sufficiently securing moisture resistance by the passivation film, diffusion of hydrogen contained in the passivation film can be suppressed and the threshold fluctuation of the memory cell can be suppressed.

What is claimed is:

1. A method of manufacturing a nonvolatile semiconductor memory device, comprising:
   forming a memory cell structure in a memory cell region on a semiconductor substrate and forming an element structure in a peripheral circuit region excluding the memory cell region on the semiconductor substrate;
   forming an interlayer insulating layer covering the memory cell structure and the element structure;
   forming a Ti-containing conductive film on the interlayer insulating layer; and
   forming a Ti-containing wiring layer in an upper layer of the peripheral circuit region by selectively etching the Ti-containing conductive film and forming a Ti-containing barrier in an upper layer of the memory cell region, the barrier covering the memory cell region.

2. The method according to claim 1 further comprising:
   forming a passivation layer any of on and above the Ti-containing wiring layer and the Ti-containing barrier.

3. The method according to claim 2, wherein the passivation layer formation comprises depositing of a TEOS film by use of a plasma CVD method and depositing a silicon nitride film by use of the plasma CVD method.

4. A method of manufacturing a nonvolatile semiconductor memory device, comprising:

forming a memory cell structure and selection gate transistors in a memory cell region on a semiconductor substrate;

forming a first insulating layer covering the memory cell structure and the selection gate transistors;

forming a plurality of bit lines above the first insulating layer;

forming a second insulating layer disposed on the bit lines;

forming a Ti-containing barrier film disposed on the second insulating layer and which covers the entire memory cell region continuously;

removing the Ti-containing barrier film on the selection gate transistors; and forming a passivation layer disposed on the entire memory cell region.

5. A method of manufacturing a nonvolatile semiconductor memory device, comprising:

forming a memory cell transistor in a memory cell region and a peripheral transistor in a peripheral region on a semiconductor substrate;

forming a first insulating layer covering the memory cell region and the peripheral region;

forming a plurality of bit lines above the first insulating layer;

forming a second insulating layer disposed on the bit lines;

forming a Ti-containing layer disposed on the second insulating layer;

forming a resist pattern on the Ti-containing layer so as to form a wiring pattern in the peripheral region and form a barrier layer covering the entire memory cell region;

etching the Ti-containing layer using the resist pattern; and forming a passivation Layer on the Ti-containing layer.

* * * * *